(12) United States Patent
Lee

(10) Patent No.: US 8,049,257 B2
(45) Date of Patent: Nov. 1, 2011

(54) CMOS IMAGE SENSOR

(75) Inventor: Sang Gi Lee, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 589 days.

(21) Appl. No.: 12/190,576

(22) Filed: Aug. 12, 2008

(65) Prior Publication Data
US 2008/0303073 A1    Dec. 11, 2008

Related U.S. Application Data

(62) Division of application No. 11/324,043, filed on Dec. 29, 2005, now Pat. No. 7,423,307.

(30) Foreign Application Priority Data

Dec. 30, 2004 (KR) .................. 10-2004-0117181

(51) Int. Cl.
*H01L 31/062* (2006.01)
(52) U.S. Cl. ............. 257/294; 257/E27.113; 257/27.15; 438/70
(58) Field of Classification Search .................. 257/233, 257/290–292, 294, E27.133, E27.15; 438/70
See application file for complete search history.

(56) References Cited

U.S. PATENT DOCUMENTS

| | | | |
|---|---|---|---|
| 4,239,554 A | 12/1980 | Yamazaki | |
| 4,722,910 A | 2/1988 | Yasaitis | |
| 5,162,887 A | 11/1992 | Dierschke | |
| 5,494,857 A | 2/1996 | Cooperman et al. | |
| 6,055,460 A | 4/2000 | Shopbell | |
| 6,110,788 A | 8/2000 | Violette et al. | |
| 6,128,091 A | 10/2000 | Uchida et al. | |
| 6,187,684 B1 | 2/2001 | Farber et al. | |
| 6,194,770 B1 | 2/2001 | Zarnowski et al. | |
| 6,379,992 B2 | 4/2002 | Jo | |
| 6,414,343 B1 | 7/2002 | Kondo et al. | |

(Continued)

FOREIGN PATENT DOCUMENTS

JP     06-132505 A     5/1994

(Continued)

OTHER PUBLICATIONS

Koichiro Okumura and Sakae Hashimoto; "Optoelectric Transducer and Its Manufacturing Method"; Patent Abstracts of Japan; Publication No. 2004-356270; Publication Date: Dec. 16, 2004; Japan Patent Office, Japan.

(Continued)

*Primary Examiner* — David Vu
(74) *Attorney, Agent, or Firm* — The Law Offices of Andrew D. Fortney; Andrew D. Fortney; Ryan S. Dunning

(57) ABSTRACT

Provided are a CMOS image sensor in which microlenses are formed in a remaining space in a patterned light shielding layer to improve image sensor characteristics and to protect the microlenses during packaging. The CMOS image sensor may include: a semiconductor substrate; at least one photodiode on or in the semiconductor substrate; a first insulating layer on the substrate including the photodiode(s); a plurality of metal lines on and/or in the first insulating layer; a second insulating layer on the first insulating layer including at least some of the metal lines; a patterned light shielding layer on the second insulating layer; and microlenses in a remaining space on the second insulating layer.

17 Claims, 5 Drawing Sheets

U.S. PATENT DOCUMENTS

| | | | |
|---|---|---|---|
| 6,580,109 | B1 | 6/2003 | Thomas et al. |
| 6,646,318 | B1 | 11/2003 | Hopper et al. |
| 6,746,933 | B1 | 6/2004 | Beintner et al. |
| 6,875,558 | B1 | 4/2005 | Gaillard et al. |
| 6,949,424 | B2 | 9/2005 | Springer |
| 7,132,724 | B1 | 11/2006 | Merrill |
| 7,279,353 | B2 | 10/2007 | Rhodes |
| 7,419,844 | B2 | 9/2008 | Lee et al. |
| 2002/0058353 | A1 | 5/2002 | Merrill |
| 2006/0056034 | A1 | 3/2006 | Tsuruma |
| 2006/0073623 | A1 | 4/2006 | Conley, Jr. et al. |
| 2006/0086957 | A1* | 4/2006 | Kang .......................... 257/292 |
| 2006/0145224 | A1 | 7/2006 | Lee |
| 2008/0142857 | A1 | 6/2008 | Park |

FOREIGN PATENT DOCUMENTS

| | | |
|---|---|---|
| JP | 8-148665 A | 6/1996 |
| JP | 09-222505 A | 8/1997 |
| JP | 2001-68658 A | 3/2001 |
| JP | 2004-172335 A | 6/2004 |
| JP | 2004-356270 A | 12/2004 |
| KR | 0165376 B1 | 9/1998 |

OTHER PUBLICATIONS

Tadakuni Narabe; "Solid-State Imaging Apparatus"; Patent Abstracts of Japan; Publication No. 2004-172335; Publication Date: Jun. 17, 2004; Japan Patent Office, Japan.

Masanori Ohashi; "Solid-State Image Sensing Element and Manufacture Thereof", Patent Abstracts of Japan; Publication No. 06-132505; Publication Date: May 13, 1994; Japan Patent Office, Japan.

Japanese Office Action dated Nov. 25, 2008; Japanese Patent Application No. 2005-358615; Japan Patent Office, Japan.

Chinese Office Action dated Nov. 23, 2007 and English Translation; Chinese Patent Application No. 200510097115.8, filed Dec. 30, 2005; The State Intellectual Property Office of P.R.C., People's Republic of China.

Takashi Nakano and Shinichi Teranishi; "Solid Image Pickup Element"; Patent Abstracts of Japan; Publication No. 08-148665; Publication Date: Jun. 7, 1996; Japan Patent Office, Japan.

Tomohiko Otani; "Device Having Microlens and Shape of Microlens"; Patent Abstracts of Japan; Publication No. 09-222505; Publication Date: Aug. 26, 1997; Japan Patent Office, Japan.

Koichi Harada, Yasuhiro Ueda, Nobuhiko Umetsu, Kazuji Wada, Yoshitetsu Toumiya and Takeshi Matsuda; "Solid State Image Sensor and Fabrication Thereof"; Patent Abstracts of Japan; Publication No. JP 2001068658 A; Publication Date: Mar. 16, 2001; Japan Patent Office, Japan.

Sang Sik Kim, Seong Gyun Kim and No Seok Yang; "CCD Image Sensor and Method for Manufacturing the Same"; Korean Patent Abstracts; Publication No. 100165376 B1; Publication Date: Sep. 16, 1998; Korean Intellectual Property Office, Republic of Korea.

Stanley Wolf, Ph.D.; "Silicon Processing for the VLSI ERA"; vol. 2: Process Integration; Chapter 2, pp. 12 to 13; Lattice Press, Sunset Beach, CA, US; ISBN 0-961672-4-5.

Sang Gi Lee; "CMOS Image Sensor and Method for Fabricating the Same"; U.S. Appl. No. 11/324,043, filed Dec. 29, 2005.

Sang Gi Lee; "Method for Fabricating Vertical CMOS Image Sensor"; U.S. Appl. No. 11/296,234, filed Dec. 6, 2005.

Chang Lee; "Photodiode in CMOS Image Sensor and Fabricating Method Thereof"; U.S. Appl. No. 11/319,813, filed Dec. 27, 2005.

* cited by examiner

CMOS IMAGE SENSOR

This application is a divisional of U.S. patent application Ser. No. 11/324,043 filed on Dec. 29, 2005 now U.S. Pat. No. 7,423,307. This application also claims the benefit of the Korean Patent Application No. 10-2004-0117181, filed on Dec. 30, 2004, which is hereby incorporated by reference as if fully set forth herein.

BACKGROUND OF THE INVENTION

1. Field of the Invention

The present invention relates to a CMOS image sensor and a method of fabricating the same, and more particularly, to a CMOS image sensor in which light shielding layers are formed between microlenses to improve reflection characteristics and to protect the microlenses upon packaging, and a method of fabricating the same.

2. Discussion of the Related Art

Generally, an image sensor is a semiconductor device that converts an optical image to an electric signal. In a CCD (charge coupled device) image sensor, a plurality of MOS (metal-oxide-metal) capacitors are arranged close to one another to transfer and store electric charge carriers. In a CMOS (complementary MOS) image sensor, a plurality of MOS transistors corresponding to the number of pixels are fabricated by CMOS technology. CMOS image sensors also typically include a control circuit and a signal processing circuit as peripheral circuits and a switching system that detects outputs of photosensors such as photodiodes step by step using the MOS transistors.

Hereinafter, a CMOS image sensor and a method of fabricating the same according to the related art will be described in detail with reference to FIG. 1 of the attached drawings, which shows a cross-sectional view illustrating a CMOS image sensor according to the related art.

A plurality of photodiodes 11 are formed on a semiconductor substrate 10, and first insulating layers 12 and metal lines 13 are alternately formed on the semiconductor substrate 10 including the photodiodes 11 in plural. (For clarity, interfaces between adjacent insulator layers in the first insulating layers 12 are not shown.) Then, a second insulating layer 14 including an oxide layer is formed on the first insulating layer 12 and planarized. A light shielding material is formed and patterned on the second insulating layer 14 to form a patterned light shielding layer 15. Then, in order to protect the patterned light shielding layer 15, a third insulating layer 16 (e.g., an oxide layer or a nitride layer) is formed on the light shielding layer 15 and planarized. The planarization typically uses a chemical mechanical polishing (CMP) method. Then, microlenses 17 are formed on the third insulating layer 16 between the light shielding layers 15. As shown in FIG. 1, the microlenses 17 partially overlap the ends of the light shielding layers 15.

The CMOS image sensor and the method of fabricating the same according to the related art have the following problems. In the case of using the light shielding layer, since the method forms a planarized insulating layer for protecting the light shielding layer and for providing a planar surface for subsequent formation of microlenses, the number of steps increases and thus manufacturing efficiency decreases. Also, since the packaging process is performed after the microlenses are formed (and, in some cases, while the microlenses are exposed), protecting the microlenses during packaging can be difficult and/or unnecessarily complex.

SUMMARY OF THE INVENTION

Accordingly, the present invention is directed to a CMOS image sensor and a method for fabricating the same that substantially obviates one or more problems due to limitations and disadvantages of the related art.

An object of the present invention is to provide a CMOS image sensor and a method for fabricating the same in which light-shielding layers are formed between microlenses to improve reflection characteristics and to protect the microlenses during packaging.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure(s) and process step(s) and/or condition(s) particularly pointed out in the written description and claims hereof as well as the appended drawings.

To achieve these objects and other advantages and in accordance with the purpose of the invention, as embodied and broadly described herein, a CMOS image sensor according to an aspect of the present invention may include a semiconductor substrate, a plurality of photodiodes on the semiconductor substrate, a first insulating layer on the substrate including the photodiodes, one or more metal interconnections on and/or in the first insulating layer, a second insulating layer on the first insulating layer including the metal interconnection, a patterned light shielding layer on the second insulating layer, and microlenses in a remaining space on the second insulating layer.

Preferably, the light shielding layer pattern corresponds to the metal interconnection(s), the patterned light shielding layer and the microlenses do not overlap each other, and/or the patterned light shielding layer has at least the same thickness as that of the microlenses.

In another aspect of the present invention, a method for fabricating a CMOS image sensor may include forming a plurality of photodiodes on a semiconductor substrate, forming a first insulating layer on the substrate including the photodiodes, forming one or more metal interconnections on and/or in the first insulating layer, forming a second insulating layer on the first insulating layer including the metal interconnection(s), forming a patterned light shielding layer on the second insulating layer, and forming microlenses in a remaining space on the second insulating layer.

Preferably, the step of forming the microlenses may further include forming a microlens material on the second insulating layer including the light shielding layers, planarizing the microlens material, and forming the microlenses by performing a bake process. Also, the step of planarizing the microlens material may include etching and/or selectively etching the microlens material.

Preferably, after planarization, the microlens material has a thickness equal to or less than that of the light shielding layer.

Preferably, the light shielding layer pattern corresponds to the metal interconnection(s), and/or the patterned light shielding layer and the microlenses do not overlap each other.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2a to 2g are cross-sectional views illustrating a method of fabricating a CMOS image sensor according to the present invention.

Figure 1:
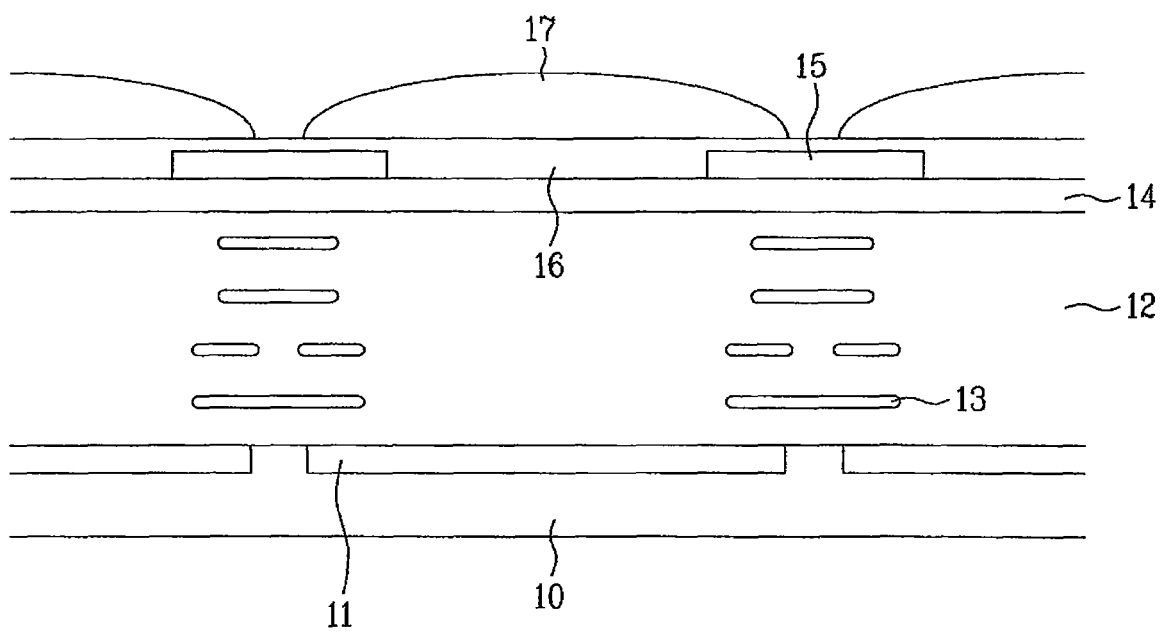
FIG. 1 is a cross-sectional view illustrating a CMOS image sensor according to the related art.
Figure 2A:
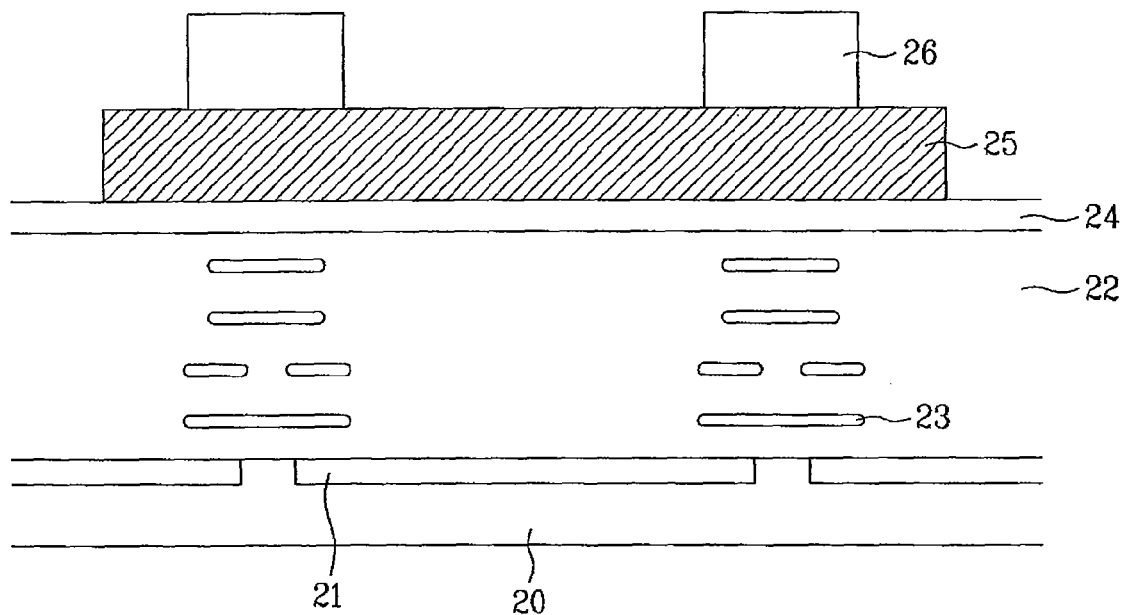
FIGS. 2a to 2g are cross-sectional views illustrating a method of fabricating a CMOS image sensor according to the present invention.

As illustrated in FIG. 2a, a plurality of photodiodes 21 are formed on a semiconductor substrate 20, and one or more first insulating layers 22 and metal lines (or interconnections) 23 are alternately formed on the semiconductor substrate 20 including the photodiodes 21 in plural. After an uppermost metal line is formed, a second insulating layer 24 comprising an oxide layer and/or a nitride layer is formed on the first insulating layer 22 and the uppermost metal line, and the second insulating layer 24 is planarized. The planarization generally comprises chemical mechanical polishing (CMP). Then, a light shielding layer material 25 is formed on the second insulating layer 24. Although a discontinuous light shielding layer material 25 is shown, a continuous light shielding layer material 25 may be formed by known blanket deposition techniques. Generally, light shielding layer material 25 comprises a material that is opaque to visible light (e.g., a black material or a material containing a black substance such as carbon, graphite or $CrO_3$). Then, after a photoresist is coated on the light shielding layer material 25 and exposed and developed using a microlens mask, the photoresist on the microlens regions is removed to form a photoresist pattern 26.

Figure 2B:
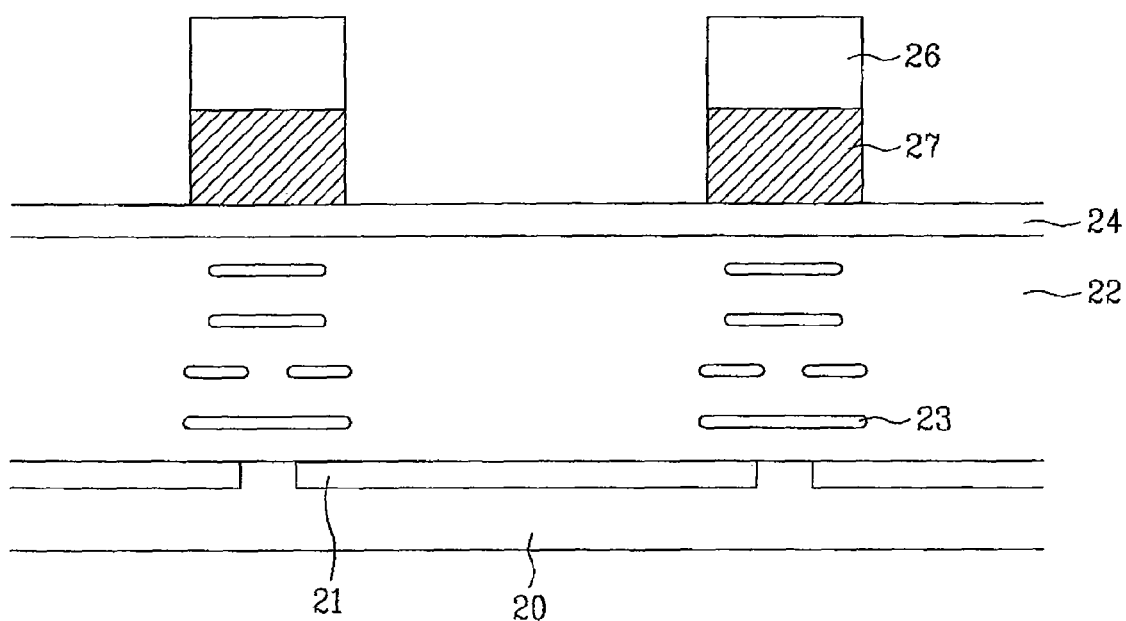

As illustrated in FIG. 2b, the light shielding layer material 25 is etched using the photoresist pattern 26 as a mask to form patterned light shielding layer 27.

Figure 2C:
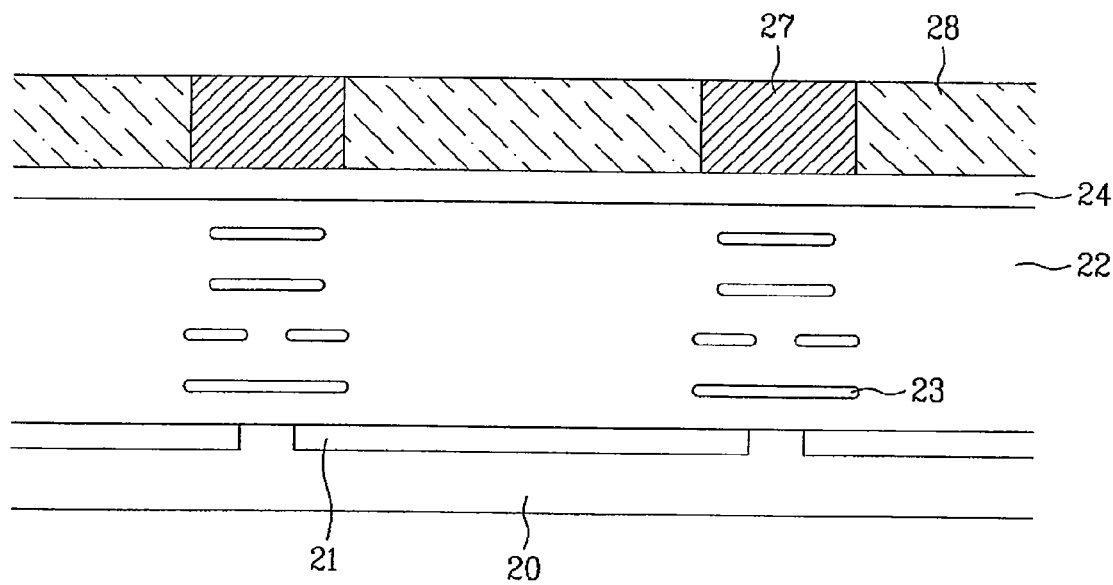

As illustrated in FIG. 2c, the photoresist pattern 26 is removed, a microlens material is formed on the patterned light shielding layer 27 and the second insulating layer 24 and is planarized using a CMP or etchback method to form a microlens layer (comprising, e.g., a plurality of microlens bodies 28) in the remaining space on the second insulating layer 24 not occupied by the patterned light shielding layer 27 (e.g., between lines or other structures in the light shielding layer pattern 27). At this time, the deposited microlens material has a thickness greater than that of the microlens, in consideration of the amount of material removed during planarization.

Preferably, the microlens bodies 28 have a thickness equal to or less than the thickness of the patterned light shielding layer 27. Such a configuration may facilitate protecting the microlenses during the packaging process.

Figure 2D:
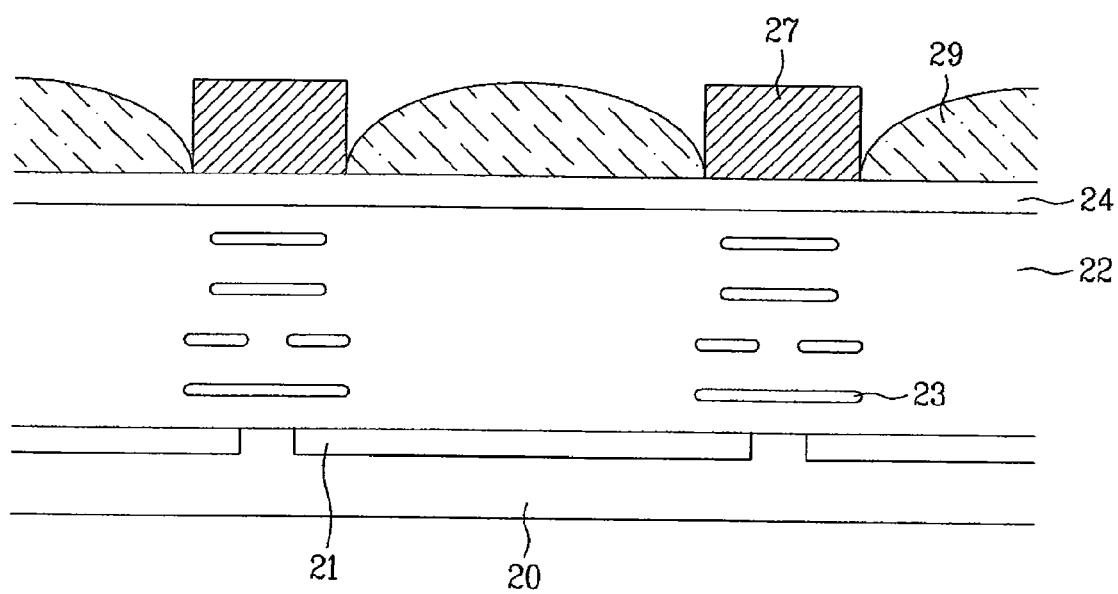

As illustrated in FIG. 2d, the microlens bodies 28 are baked at a predetermined temperature to form microlenses 29.

Figure 2E:
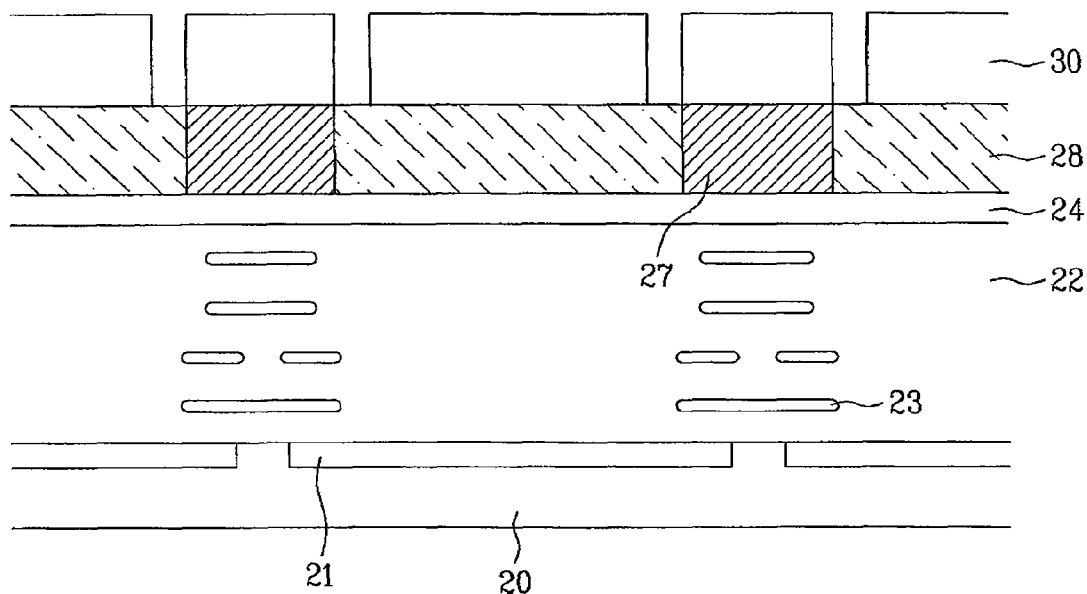

Meanwhile, in a further embodiment, the microlenses may be formed by selectively etching the microlens material 28. Particularly, as illustrated in FIG. 2e, a photoresist pattern 30 (generally comprising photoresist pattern 26 and a further "microlens body" pattern over microlens bodies 28) is formed on the microlens material 28 to expose predetermined peripheral portion(s) of the microlens material 28.

Figure 2F:
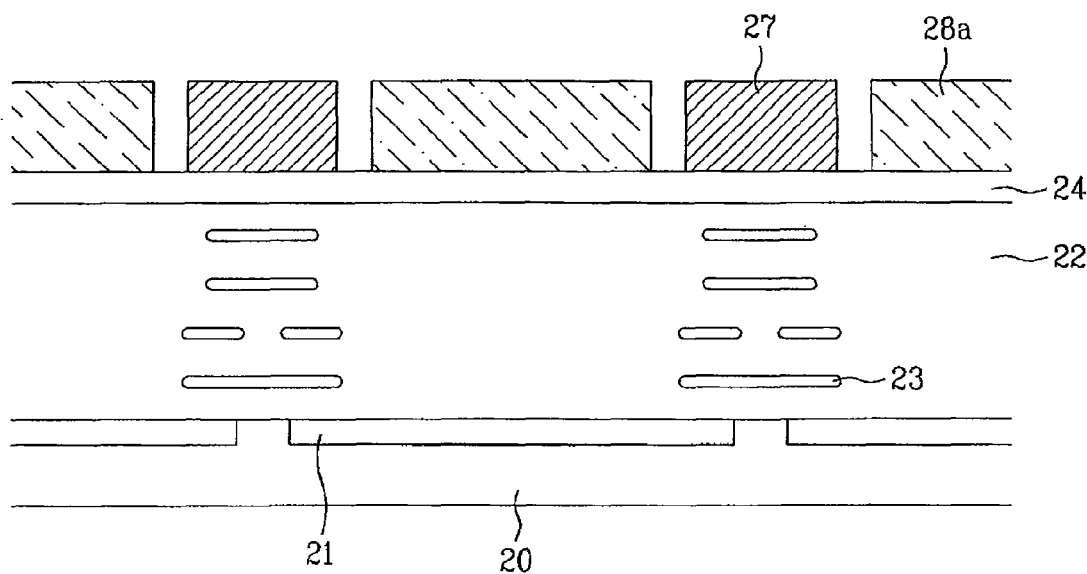

Subsequently, as illustrated in FIG. 2f, the microlens material 28 is selectively etched using the photoresist pattern 30 as mask and the photoresist pattern 30 is removed to form patterned microlens bodies 28a.

Figure 2G:
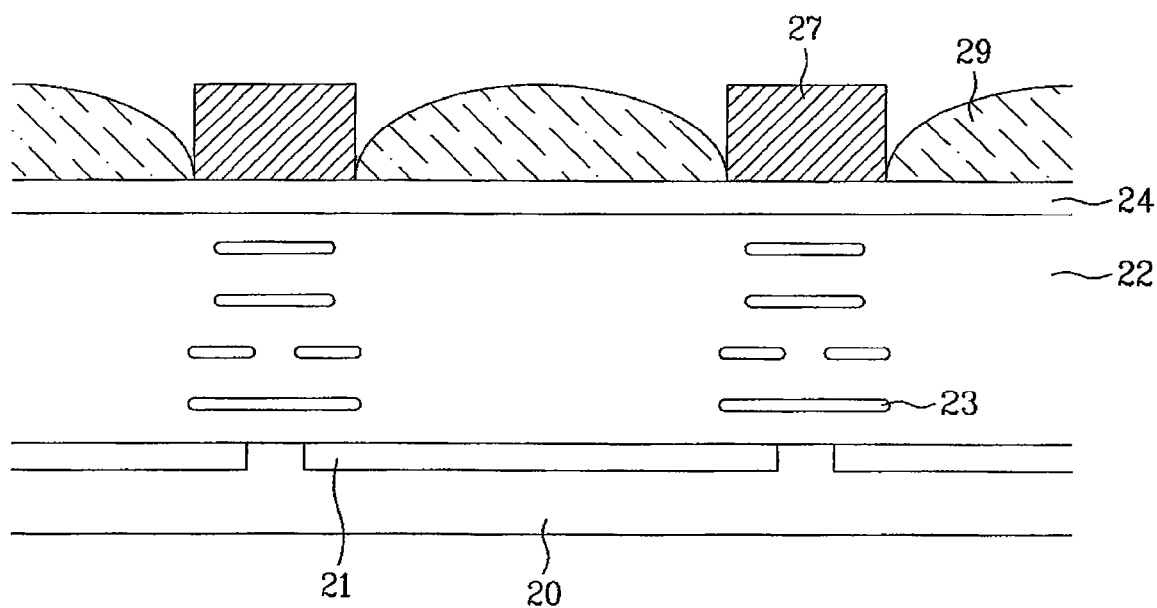

As illustrated in FIG. 2g, the patterned microlens bodies 28a are baked at a predetermined temperature to form microlenses 29.

According to the present invention, since the microlenses are formed in a remaining space in a patterned light shielding layer, optionally in a self aligned manner, the microlenses are generally well-aligned, and the space for the microlenses can be easily ensured. In addition, since the light shielding layer is between the microlenses, light efficiency can increase (e.g., using characteristic light transmission through the microlenses and reflection from the metal lines.

Furthermore, since the microlenses may have a thickness equal to or less than thickness of the light shielding layer, the microlenses can be protected during packaging, and thus yield and production can be improved.

What is claimed is:

1. A CMOS image sensor comprising:
a semiconductor substrate;
a plurality of photodiodes on or in the semiconductor substrate;
a first insulating layer on the substrate including the photodiodes;
a plurality of metal lines on or in the first insulating layer;
a second insulating layer on the first insulating layer and at least some of the metal lines;
a patterned light shielding layer on the second insulating layer; and
microlenses in a remaining space on the second insulating layer not occupied by the patterned light shielding layer.

2. The CMOS image sensor according to claim 1, wherein the light shielding layer pattern corresponds to the metal lines.

3. The CMOS image sensor according to claim 1, wherein the patterned light shielding layer and the microlenses do not overlap each other.

4. The CMOS image sensor according to claim 1, wherein the light shielding layer has a thickness at least equal to that of the microlenses.

5. The CMOS image sensor according to claim 4, wherein the light shielding layer has a thickness greater than that of the microlenses.

6. The CMOS image sensor according to claim 1, wherein the second insulating layer comprises a planarized oxide and/or nitride layer.

7. The CMOS image sensor according to claim 6, wherein the second insulating layer comprises a planarized oxide layer.

8. The CMOS image sensor according to claim 6, wherein the second insulating layer comprises a planarized nitride layer.

9. The CMOS image sensor according to claim 1, wherein the microlenses are self-aligned to ensure space for the microlenses.

10. The CMOS image sensor according to claim 1, wherein the patterned light shielding layer comprises a plurality of light shielding structures.

11. The CMOS image sensor according to claim 10, wherein the microlenses are between adjacent light shielding structures.

12. The CMOS image sensor according to claim 11, wherein the microlenses extend an entire length between adjacent light shielding structures.

13. The CMOS image sensor according to claim 1, wherein the microlenses occupy an entire remaining space on the second insulating layer.

14. The CMOS image sensor according to claim 1, wherein the second insulating layer has a planarized upper surface.

15. The CMOS image sensor according to claim 14, wherein lower surfaces of the light shielding layer and microlenses are co-planar with the upper surface of the second insulating layer.

16. The CMOS image sensor according to claim 1, wherein the light shielding layer comprises at least one of carbon, graphite, or $CrO_3$.

17. The CMOS image sensor according to claim 1, wherein the light shielding layer has a thickness substantially equal to that of the microlenses.

* * * * *